(12) United States Patent
Austin et al.

(10) Patent No.: US 6,459,102 B1
(45) Date of Patent: Oct. 1, 2002

(54) PERIPHERAL STRUCTURE FOR MONOLITHIC POWER DEVICE

(75) Inventors: Patrick Austin, l'Union; Jean-Louis Sanchez, Escalquens; Olivier Causse, Onet le Chateau; Marie Breil, Toulouse; Jean-Pierre Laur, Albi; Jean Jalade, Castanet-Tolosan, all of (FR)

(73) Assignee: Centre National de la Recherche Scientifique, Paris (FR)

( * ) Notice: Subject to any disclaimer, the term of this patent is extended or adjusted under 35 U.S.C. 154(b) by 0 days.

(21) Appl. No.: 09/868,517

(22) PCT Filed: Dec. 14, 1999

(86) PCT No.: PCT/FR99/03134

§ 371 (c)(1),
(2), (4) Date: Oct. 9, 2001

(87) PCT Pub. No.: WO00/38243

PCT Pub. Date: Jun. 29, 2000

(30) Foreign Application Priority Data

Dec. 18, 1998 (FR) ............................................. 98 16060

(51) Int. Cl.[7] .................. H01L 29/74; H01L 31/111
(52) U.S. Cl. .................. 257/170; 257/169; 257/171; 257/578; 257/566; 257/577; 257/583; 257/584

(58) Field of Search .................................. 287/107, 108, 287/109, 111, 112, 154, 156, 162, 163, 164, 165, 166, 167, 170, 172, 169, 132, 578, 579, 580, 213, 256, 287, 288, 327, 335, 341, 342, 343, 344

(56) References Cited

U.S. PATENT DOCUMENTS 3,795,846 A    3/1974   Ogawa et al.

FOREIGN PATENT DOCUMENTS

| EP | 0 521 558 | 1/1993 |
|----|-----------|--------|
| EP | 0 818 825 | 1/1998 |
| EP | 0 821 411 | 1/1998 |
| WO | WO 83/00582 | 2/1983 |

*Primary Examiner*—Olik Chaudhuri
*Assistant Examiner*—Dana Farahani
(74) *Attorney, Agent, or Firm*—Young & Thompson

(57) ABSTRACT

A peripheral structure for a monolithic power device, preferably planar, includes front and rear surfaces, connected respectively to a cathode and an anode, two junctions respectively reverse-biased and forward-biased when a direct and adjacent voltage is respectively applied to the two surfaces and at least an insulating box connecting the front and rear surfaces. The structure is such that when a direct voltage or a reverse voltage is applied, generating equipotential voltage lines, the insulating box enables to distribute the equipotential lines in the substrate.

13 Claims, 7 Drawing Sheets

PERIPHERAL STRUCTURE FOR MONOLITHIC POWER DEVICE

Peripheral structure for monolithic power device This invention concerns a peripheral structure for a monolithic power device.

Conventional integrated circuits usually differentiate themselves by the layout of masks. They are thus frozen vertically and therefore little suited for power integration evolution. Consequently, in order to create new power functions, structures made of technological bricks compatible among themselves, are used preferably.

Thus, integrated components for monolithic power device in planar technology are known. It is essential that such components exhibit good voltage handling, i.e. they have a maximum electric field before avalanche breakdown that is sufficiently high to sustain the voltages desired, while remaining smaller than the critical electric field. The maximum electric field must be controllable when designing and manufacturing the component.

This control relies for the whole semi-conductor power devices known on so-called 'guard' solutions, based upon a spread of equipotential lines at the surface of the component and at the junction levels.

Thus, mesa-type techniques consist of mechanical chamfering of a junction to be protected. However, these techniques are hardly compatible with planar processes enabling the realisation of integrated complex power devices. Moreover, it excludes MOS technology processes, such as IGBT (Insulated Gate Bipolar Transistor) bipolar-MOS or MCT (MOS Controlled Thyristor) thyristor-MOS technologies.

Other guard techniques implement guard rings, field electrodes or field plates, semi-resistive layers or P-junction terminations (JTE—Junction Termination Extension). The junction termination type technique, notably, consists of an implantation of a little doped P-region, all around a main junction to be protected and in contact with the said junction. The integrated components using these different guard techniques comprise generally insulating boxes formed laterally in the component and with a shrunk central portion, as well as a stop channel for the potential lines between the main junction and one of the diffusions of the insulating box.

A shortcoming of these guard techniques is that they require a minimum surface in order to control the maximum electric field. Moreover, the manufacture is made more complicated by the necessity of implanting a stop channel. The components using these guard techniques exhibit moreover dissymmetrical voltage handling and therefore constitute technological bricks with reduced reach.

In particular, certain devices exhibit a rear-faced junction, connected physically to lateral insulating boxes, and a front-faced junction, protected by one of the guard techniques and surrounded laterally by stop channels. When the front junction is reverse-biased, the equipotential lines are blocked at the stop channels and do not reach the insulating boxes, whereas when the rear junction is reverse-biased, the equipotential lines rise towards the front face through the insulating boxes.

Besides the shortcomings mentioned, this realisation only enables to introduce elementary electric functions in the box delineated by the rear junction.

This invention concerns a peripheral structure for a monolithic power device with smaller space requirements than the components known for equal value of the critical electric field and enabling the implantation of electric functions at the front face and at the rear face.

The structure of the invention is compatible with a planar technology and enables good control of the electric field.

The invention also concerns such a peripheral structure that does not require any stop channels and that can be used with a MOS technology.

The peripheral structure according to the invention can also enable to sustain symmetrical voltages and thus be particularly supple to be used as a technological brick. This brick enables voltage symmetrisation of existing power components, such as power bipolar transistors, thyristors or IGBT components, but also the design and realisation of new components or of new power electric functions.

To that effect, the invention concerns a peripheral structure for monolithic power device comprising:
 a substrate with a first doping type,
 a front face fitted with a connection with a cathode,
 a rear face fitted with a connection with an anode,
 a first junction adjoining one of the faces, whereas this junction is reverse-biased when a direct voltage is applied between the anode and the cathode,
 a second junction adjoining the face opposite to the face corresponding to the first junction, whereas this junction is forward-biased when a direct voltage is applied between the anode and the cathode,
 at least one insulating box with a second type of doping, connecting the front and rear face and disconnected electrically from the first junction.

The structure is such that when a reverse voltage is applied between the anode and the cathode, creating equipotential voltage lines, the insulating box enables to distribute the equipotential lines in the substrate.

According to the invention, the insulating box is disconnected electrically from the second junction and the peripheral structure is such that when a direct voltage is applied between the anode and the cathode, generating equipotential voltage lines, the insulating box enables to distribute the said equipotential lines in the substrate.

Thus, conversely to known guard techniques, the insulating box(es) fulfil in the invention a distribution function of the equipotential lines in the substrate, i.e. in the volume of the structure, in both biasing directions. Thanks to that distribution, a stop channel proves superfluous and the sizes of the component can be reduced with respect to the existing ones. Besides, electric functions can be implanted on both front and rear faces. Indeed, the anode and the cathode are not in electrical contact with the insulating boxes.

The structure is also capable of sustaining symmetrical voltages. These voltages range for instance between 600 and 1200 V. In some embodiments, they reach values between 4000 and 5000 V.

Preferably, the peripheral structure comprises two lateral insulating boxes, arranged symmetrically with respect to the junctions. However, according to an embodiment variation, it comprises a single lateral insulating box on one side of the junctions, whereas another technique is used on the second side.

The peripheral structure of the invention is used advantageously in a functional integration mode, for which the power function grows out of electrical interactions between arranged and sized semi-conductor regions and also out of surface interconnections. This integration mode is particularly suited to high voltage applications, notably for connections to an electrical energy distribution network calling for symmetrical voltage handling.

According to another embodiment, the peripheral structure according to the invention is implemented in a 'smart-power' type monolithic power integration mode, for which insulating techniques are injected into the substrate in order to differentiate regions allocated to (high voltage) power functions and regions sustaining circuits for controlling and processing the signals and the (low voltage) information.

The junctions define main boxes with the second doping sign and each delineated by the corresponding junction and by the adjoining face.

Preferably, these main boxes are peripheral.

In a preferred embodiment, the substrate is of N-type and the main box and the insulating box are of P-type. The junction is then adjacent to the front face.

In another embodiment, the substrate is of P-type and the main box and the insulating box are of N-type, whereas the junction is then adjoining to the rear face.

Preferably, the insulating box is little doped and the boxes are highly doped.

In a preferred embodiment, the insulating box is made of a highly doped insulating vertical wall and the component comprises at least one small dose implantation zone of the second doping type, adjacent to that wall and to one of the front and rear faces and arranged between the wall and one of the junctions.

This embodiment of the insulating box and of its vicinity is particularly suited for the insulating box to be able to fulfil its distribution function of the equipotential lines in the substrate. It enables to gain more surface, whereas the insulating box may be reduced in width in relation to the boxes used in the known components. For exemplification purposes, the insulating box is approximately 5 $\mu$m in width.

Preferably, the insulating wall is substantially rectangular in shape.

Thereunder, the expression 'localised metallization' designates metallization of the front or rear faces that is localised to the connection associated with that face, and which therefore has a little length with respect to the length of the said face. The expression 'extended metallization' refers to non-partial metallization of one of the front or rear faces, i.e. covering a portion of that face non-localised to the connection associated with that face. Preferably, field oxides cover the rear and front faces with the exception of zones localised to the connections. When one of these faces is metallized locally, the said face then covers only the corresponding localised zone, whereas when one of these faces shows extended metallization, the said face also covers partially the corresponding field oxide.

Three preferred embodiments can therefore be distinguished according to whether extended metallization is carried out on none of the front or rear faces, on the rear face or on both rear and front faces. These three preferred embodiments combine with the insulating vertical wall with a small dose neighbouring implantation zone.

In a first embodiment, the peripheral structure comprises:

at least one small dose implantation zone of the second type of doping adjacent to the first junction and the corresponding face and arranged between the first junction and the wall, at least one second small dose implantation zone of the second type of doping adjacent to the second junction and the corresponding face and arranged between the second junction and the wall, the implantation zones adjacent to the wall, respectively adjoining the front and rear faces.

Thus, the structure comprises in the vicinity of each of the front and rear faces and going from one junction to a lateral face: the main bow delineated by the junction adjoining the front or rear face, the adjacent small dose implantation zone, a zone without any implantation, the small dose implantation zone adjacent to the wall, and the insulating wall.

This structure is suited to localised metallization of both front and rear faces.

The structure has then preferably a symmetrical configuration with respect to a plane parallel to the front and rear faces and halfway between these faces. Symmetry of voltage handling is thereby improved.

Preferably, the structure comprises two lateral insulating walls fitted with small dose implantation zones in front and rear faces, and two front and rear main boxes, each flanked laterally by two small dose implantation zones.

This first embodiment of the peripheral structure is particularly interesting for its low cost of manufacture and the gain in surface that it enables to obtain.

In a second of the three embodiments mentioned above, the structure comprises:

a rear field plate covering the whole rear face, and at least one first small dose implantation zone of the second type of doping adjoining the front face and at the corresponding junction.

Moreover, the implantation zone adjacent to the wall is adjacent to the front face.

Thanks to this realisation, we can obtain symmetrical voltage handling in spite of a substantially dissymmetrical geometry.

This is here a minimal configuration, but in some of these embodiments, the peripheral structure also comprises at least one small dose implantation zone of the second type of doping adjacent to the rear face, in the form of a zone adjacent to the rear junction and/or a zone adjacent to the wall.

Thus the peripheral structure advantageously comprises another implantation zone adjacent to the wall, adjacent to the rear face. The presence of this rear implantation zone is the more useful to enhance voltage handling as the rear junction and the wall are close.

This second embodiment of the peripheral structure enables easy and quick assembly, by soldering the rear field plate on a seat.

In the third embodiment mentioned above, the peripheral structure comprises:

a rear field plate covering the whole rear face, the implantation zones adjacent to the wall, respectively adjacent to the front and rear faces, a front field plate covering partially the front face between the connection to the cathode and the implantation zone adjacent to the wall and the front face, and at least one first small dose implantation zone of the second type of doping adjacent to one of the junctions and to the corresponding face, whereas the peripheral structure supports at least one voltage for direct-biasing of this junction.

This structure exhibits, as in the second embodiment, substantially non-symmetrical topology. It enables nevertheless to obtain symmetrical voltage handling.

Besides both front and rear implantation zones adjacent to the wall, the peripheral structure comprises at least one small dose implantation zone, adjoining one of the front or rear junctions. In the embodiment where the substrate is of N-type, that is the rear junction for direct-bias operation and the front junction for reverse-bias operation.

Preferably, the component also comprises at least one second small dose implantation zone of the second type of doping, adjoining the other junction and the corresponding face. Thus, it enables symmetrical voltage handling.

In case when only one of the front or rear junctions is extended by one (or two) small dose implantation zone, the component is particularly suited to operation in one voltage direction. However it remains capable of operating in reverse direction as well with significantly lower maximum electrical field, whereas the insulating bow fulfils its distribution role of the equipotential lines in the substrate.

This third embodiment of the structure that enables, as the second embodiment, to solder the rear face, also allows surface reduction thanks to the presence of the front plate.

According to a preferred embodiment of the small dose implantation zones adjoining the junctions, these are of the junction termination type.

In embodiment variations, they have been selected among the guard rings, the field electrodes or field plates, the semi-resistive layers or the gradual junction terminations.

The structure is preferably of planar type.

Advantageously, the first dosing type is N and the second doping type is p.

The structure is preferably symmetrical with respect to a plane perpendicular to the front and rear faces and to the plane of the substrate.

It is advantageous that the structure should comprise field oxides covering the front and rear faces in zones excluding the junctions and including the insulating boxes. These field oxides are interposed between the front and rear faces on the one hand, and the field plates on the other hand.

This invention will be understood better when reading the following description of embodiment examples of peripheral structures for monolithic power devices according to the invention, given for exemplification and non-limiting purposes, with reference to the appended drawings on which:

Figure 8:
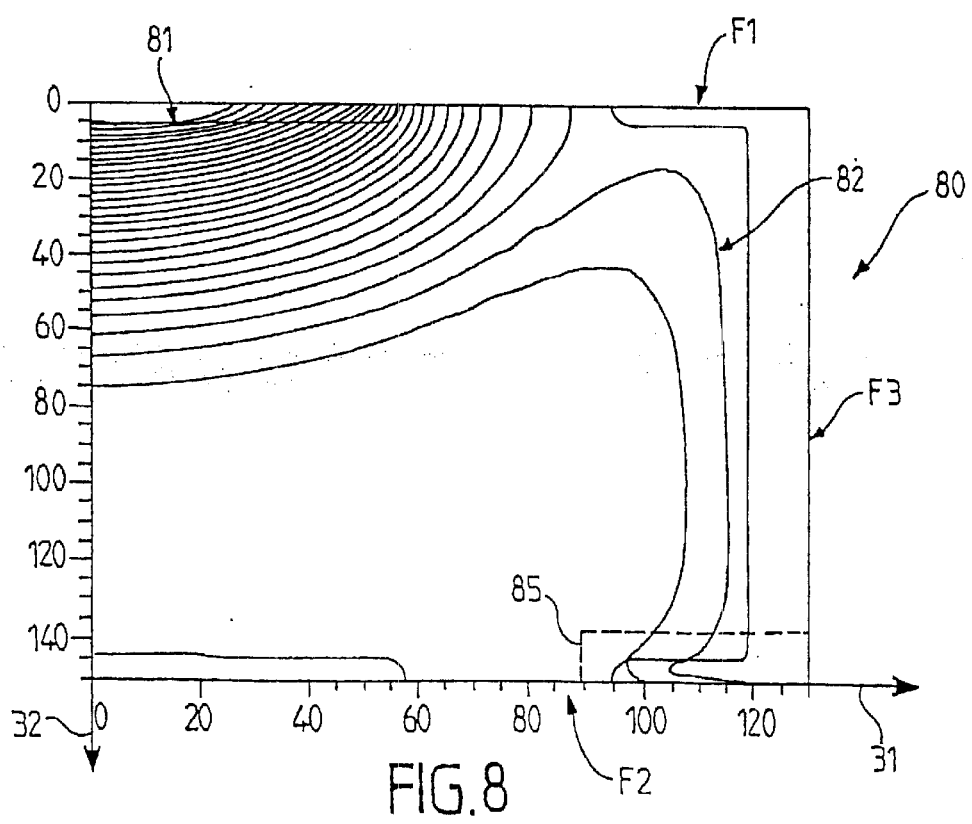
FIG. 8 shows an example of distribution of the equipotential voltage lines obtained with the embodiment of FIG. 5, in a first operating mode associated with a positive differential voltage between the anode and the cathode.
Figure 9:
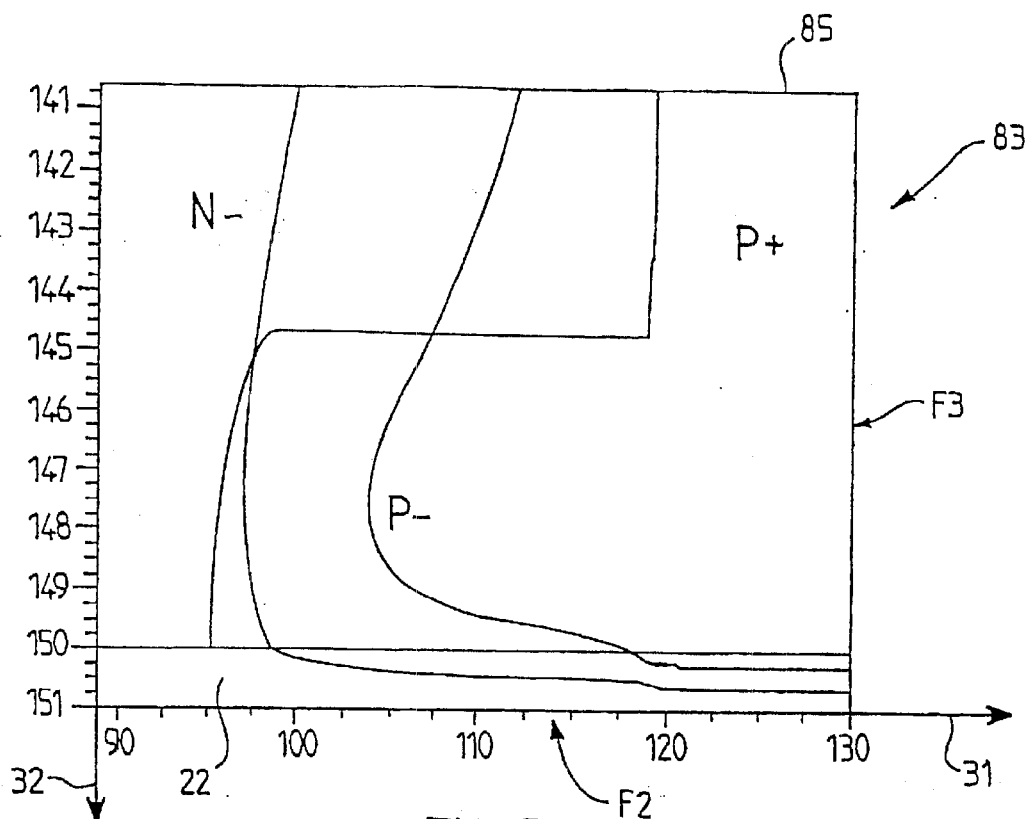
Figure 10:
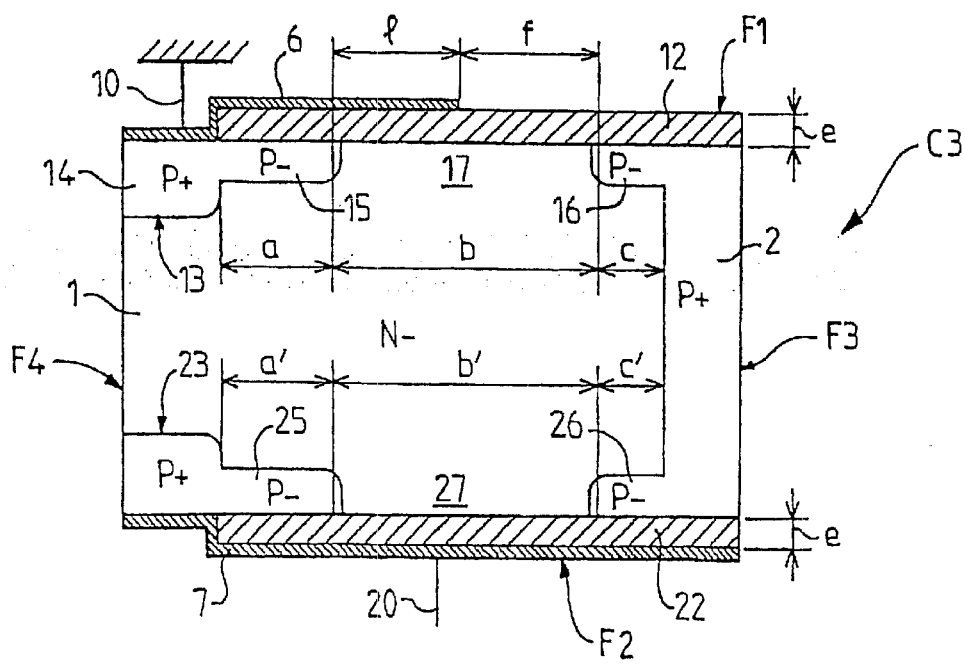
Figure 11:
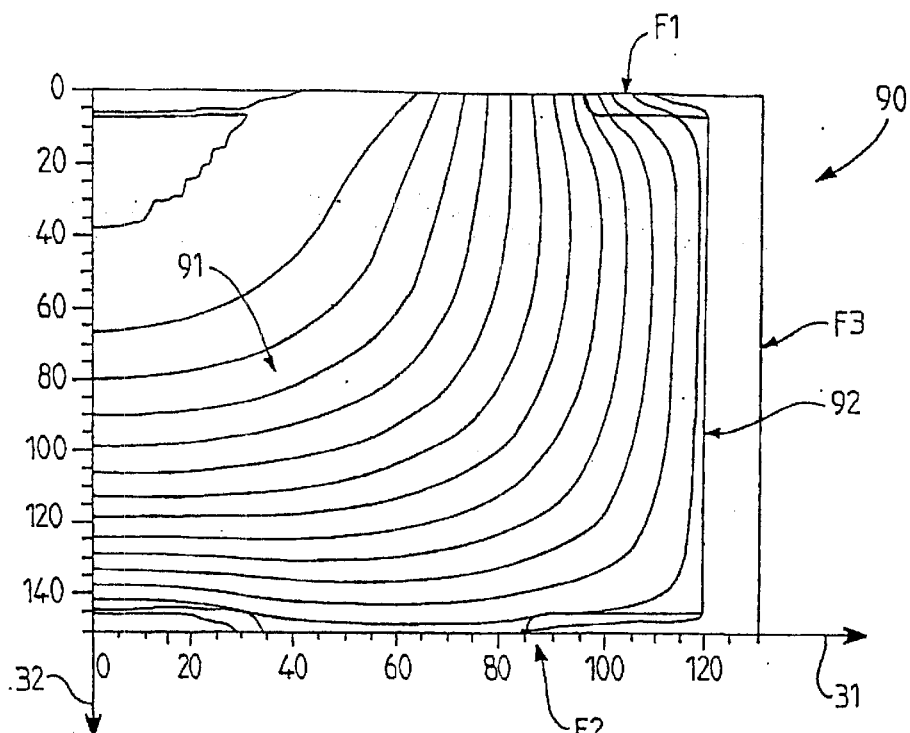
Figure 12:
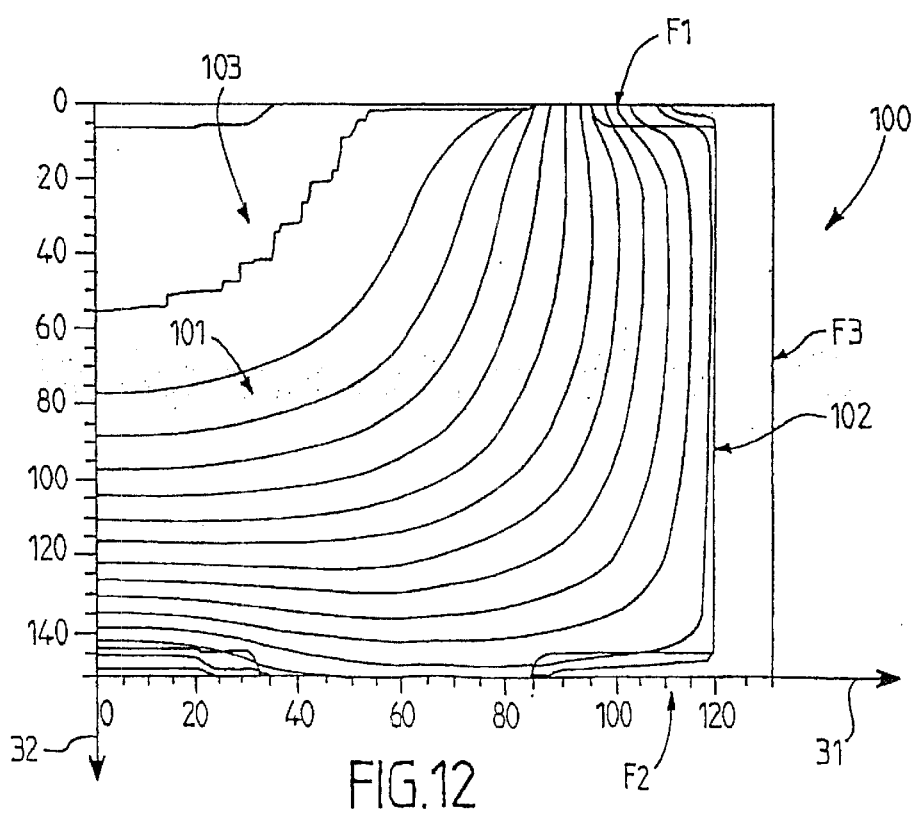
Figure 13:
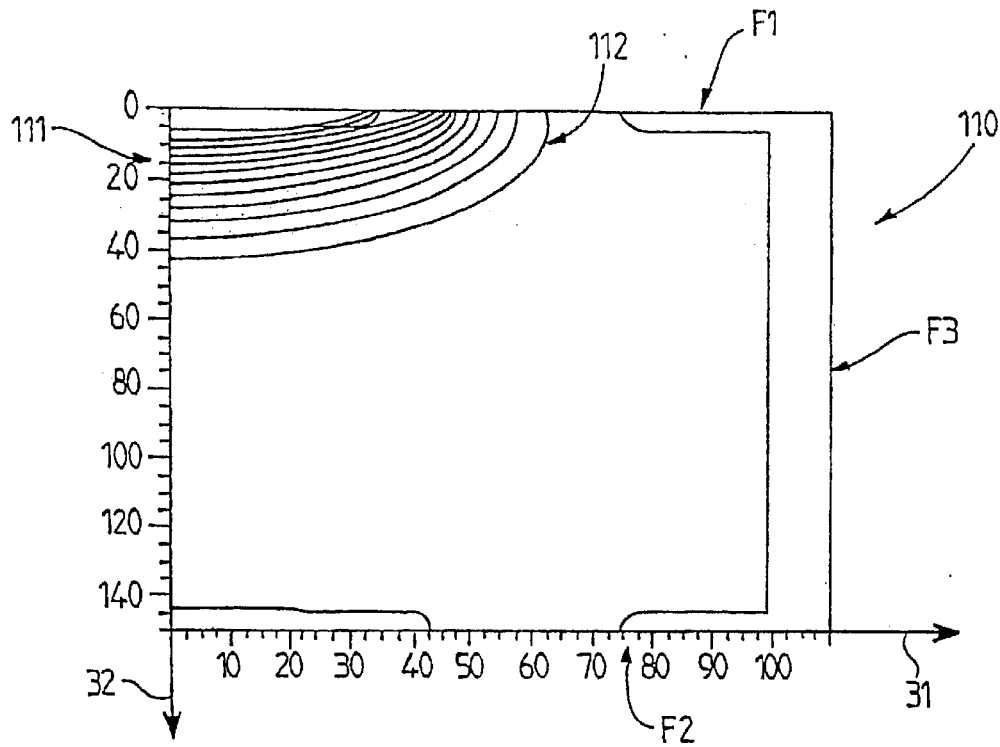
Figure 14:
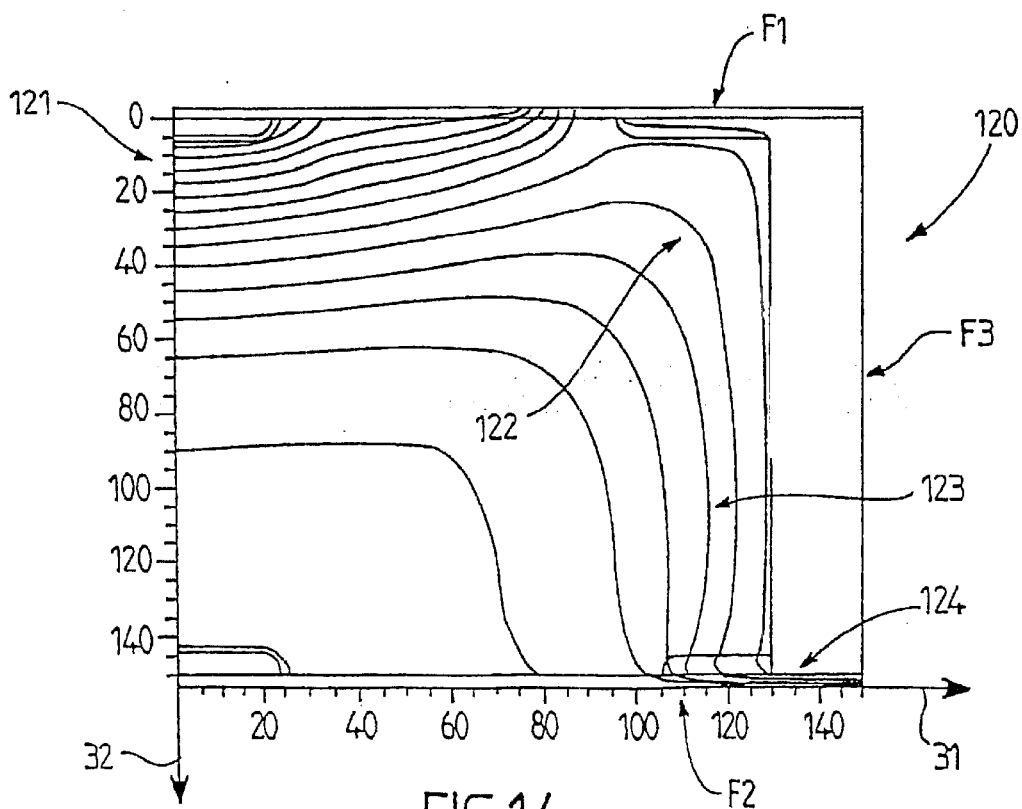

FIG. 9 visualises an enlargement of a zone represented on FIG. 8,

FIG. 10 is a diagrammatical semi-cross-sectional view of a third embodiment of a peripheral structure for monolithic power device according to the invention, comprising front and rear field plates;

FIG. 11 shows an example of distribution of the equipotential voltage lines obtained with the embodiment of FIG. 10, in a first operating mode associated with a negative differential voltage between the anode and the cathode;

FIG. 12 shows an example of distribution of the equipotential voltage lines obtained with the embodiment of FIG. 10, in a second operating mode associated with a negative differential voltage between the anode and the cathode;

FIG. 13 shows an example of distribution of the equipotential voltage lines obtained with the embodiment of FIG. 10, in a first operating mode associated with a positive differential voltage between the anode and the cathode;

FIG. 14 shows an example of distribution of the equipotential voltage lines obtained with the embodiment of FIG. 10, in a second operating mode associated with a positive differential voltage between the anode and the cathode.

All the distribution examples of equipotential voltage lines represented at FIGS. 2 to 4, 6 to 9 and 11 to 14 show the results of digital simulations. On these figures, the limits of the space load zone, in which the equipotential voltage lines are concentrated, are referred to as 200.

Figure 1:
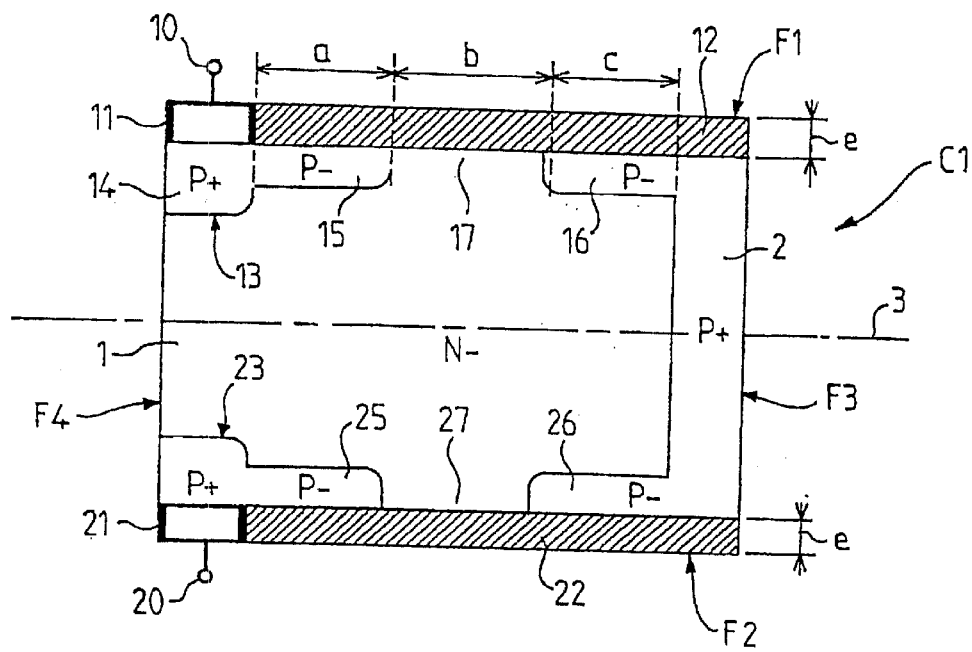
FIG. 1 is a diagrammatical semi-cross-sectional view of a first embodiment of a peripheral structure for monolithic power device according to the invention, without any field plates.
Figure 5:
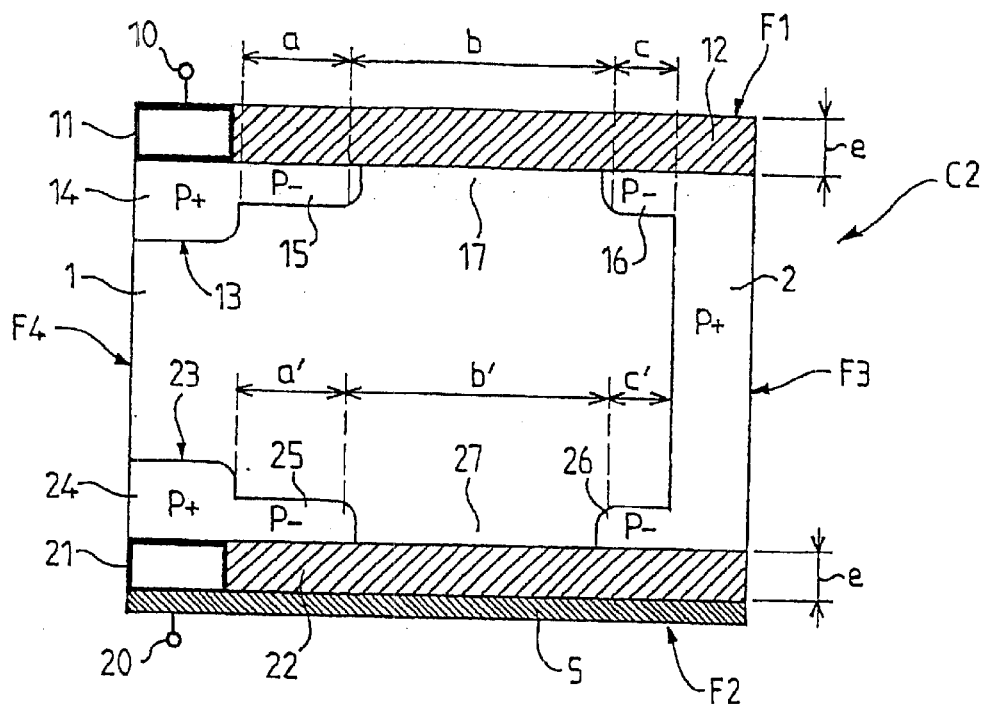
FIG. 5 is a diagrammatical semi-cross-sectional view of a second embodiment of a peripheral structure for monolithic power device according to the invention, comprising a field plate.

On FIGS. 1, 5 and 10, similar elements are identified by the same references. To simplify the representation of the structures on these figures, only half a structure is schematised, whereas the other half is obtained by symmetry. Obviously, connections to the anode and to the cathode should be excluded from this symmetry.

A first embodiment of a peripheral structure for monolithic power device, referred to as S1 (FIG. 1), is of the planar and substantially rectangular type. The semi-structure represented comprises three faces F1–F3 and a fictitious fourth face F4 delineating a pane of symmetry 4.

The faces F1 and F2, opposite to one another, comprise respectively metal parts 11 and 21 linked with connections 10 and 20 to a cathode and to an anode. The cathode is earthed advantageously. The metal parts 11 and 21 are arranged preferably to opposite ends of the faces F1 and F2. Field oxides 12 and 22 cover respectively the remainder of the faces F1 and F2.

The structure S1 comprises a substrate 1 composed of a substrate region, deep and little doped N, obtained by diffusion. A vertical insulating wall 2, highly doped P+, links the field oxides 11 and 22 of the faces F1 and F2 in ends of the faces F1 and F2 opposite to the metal parts 11 and 21. This wall 2, constituting advantageously a rectangular region, uniformly doped, is for example made by boron diffusion out of polycrystalline silicium deposited in a trench or using the thermomigration technique of aluminium. It is delineated laterally by the face F3.

In an embodiment variation, the wall 2 exhibits a rectangular shape not flaring up at the faces F1 and F2, and is made by conventional boron diffusion. A silicium surface far greater than in the previous embodiments is then necessary.

The structure S1 comprises two main peripheral boxes 14 and 24, highly doped P+ and respectively adjacent to the metal parts 11 and 21 associated with the cathode and with the anode. They delineate respectively junctions 13 and 23. Diffusions can then be introduced in these boxes 14 and 24 in order to obtain particular electrical power functions.

In the following, $VBD^+$ denotes the maximum voltage handling in reverse-bias operation of the junction 13 of the front face F1 and $VBD^-$ denotes the minimum voltage handling in reverse-bias operation of the junction 23 of the front face F2.

The junctions 13 and 23 are protected respectively by implantations 15 and 25, little doped P−, adjoining the faces F1 and F2. These implantations 15 and 25 are preferably JTE, junction termination extensions, making up a junction guard technique. In embodiment variations, the implantations 15 and 25 are selected among other guard techniques such as gradual junction terminations, rings, field electrodes and semi-resistive layers.

Two other implantations 16 and 26, little doped P− and respectively adjacent to the field oxides 12 and 22 of the faces F1 and F2 are juxtaposed to the insulating wall 2.

The planar peripheral structure S1 is preferably symmetrical with respect to a plane 3 parallel to the faces F1 and F2 and halfway between these faces. Thus, electrical behaviour and voltage handling of the structure S1 are symmetrical in relation to a bias reversal of the differential voltage between the anode and the cathode, designated thereunder as VAK.

Along each of the faces F1 and F2, we obtain therefore one of the main boxes 14 and 24, one of the implantations 15 and 25 with length a, a zone of the substrate 1 with length b, respectively noted 17 and 27, one of the implantations 16 and 26 with length c and the wall 2. For a given technological path, the structure S1 is maximised using parameters made by lengths a, b and c.

For exemplification purposes, the width of the wall 2 is in the order of 20 µm and the sum of the lengths a, b and c ranges between 80 µm and 100 µm.

To explain the operation of the structure S1, it suffices to describe it for the positive VAK voltage, since the structure S1 has a symmetrical operation when the VAK voltage is negative.

As the VAK voltage is positive, the junction 13 is reverse-biased and the junction 23 is forward-biased. Equipotential voltage lines are then available in the assembly of the structure S1. The implantation 15 protects the junction 13 while spreading the potential lines.

In a first operating mode, increasing the VAK voltage drills the electrical field at the implantation 16 and the potential lines are directed towards the lower face F2 via the wall 2. However, the electrical field does not drill in the region of the implantation 25 adjoining the rear junction 23. This first operating mode is obtained when the distance b is big enough. Thus, in a particular embodiment example, we have:

a=20 µm, b=40 µm, c=20 µm, e=1 µm, VAK=510 V, VBD$^+$= 620 V.

Figure 2:
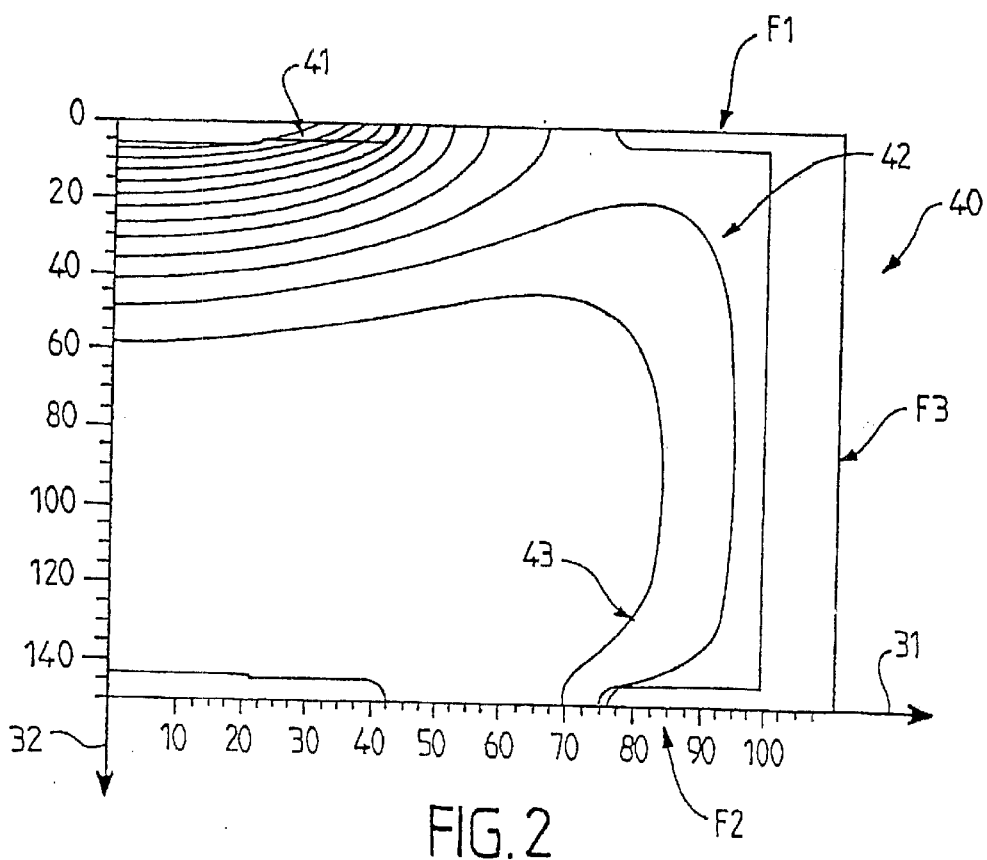
FIG. 2 shows an example of distribution of equipotential voltage lines with the embodiment of FIG. 1, in a first operating mode.

Then we represent, along the axes 31 and 32 respectively parallel to the faces F1 and F3 (graduated in microns), the equipotential lines exhibiting a distribution 40 in the volume of the structure (FIG. 2). In a zone 41 centred on the junction 13, the equipotential lines are distributed thanks to the implantation 15. In a zone 42 close to the front implantation 16 adjacent to the wall 2, the equipotential lines are directed towards the rear face F2 and in a zone 43 close to the rear implantation 26 adjacent to the wall 2, the potential lines are distributed by the implantation 26, that plays the same part as the implantation 15 while avoiding natural constriction of the equipotential lines.

Figure 3:
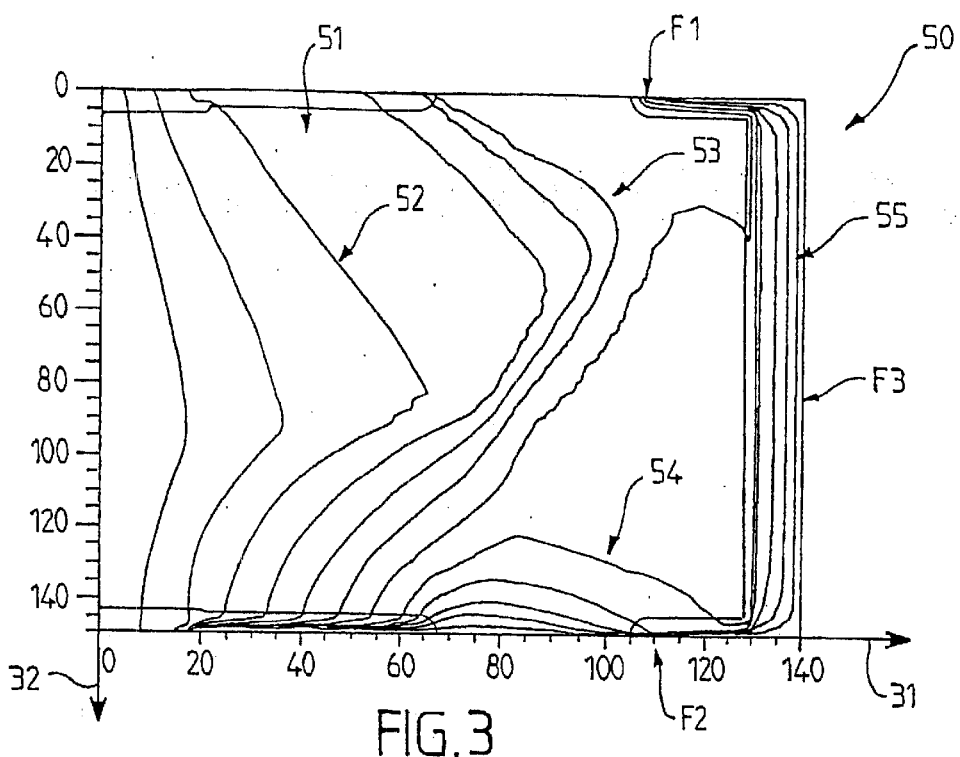
FIG. 3 shows an example of distribution of the current lines at avalanche breakdown with the embodiment of FIG. 1, in the first operating mode.

In this first operating mode, the maximum electrical field causing an avalanche breakdown is necessarily localised between the front junction 13 and the adjacent implantation 15. Thus, in an embodiment example, for which:

a=45 µm, b=45 µm, c=20 µm, e=1 µm, VAK=830 V, VBD$^+$= 850 V.

we visualise a distribution 50 of the current lines at avalanche breakdown (FIG. 3). The distribution 50 comprises a breakdown zone 51 starting from the front implantation 15 and going down to the level of the rear face F2, whereas this breakdown zone 51 is surrounded by two groups of current lines 52 and 53 going down from the front face F1 towards the rear face F2. A set of current lines is also formed in a zone 54 surrounding the rear implantation 26 adjacent to the wall 2.

Figure 4:
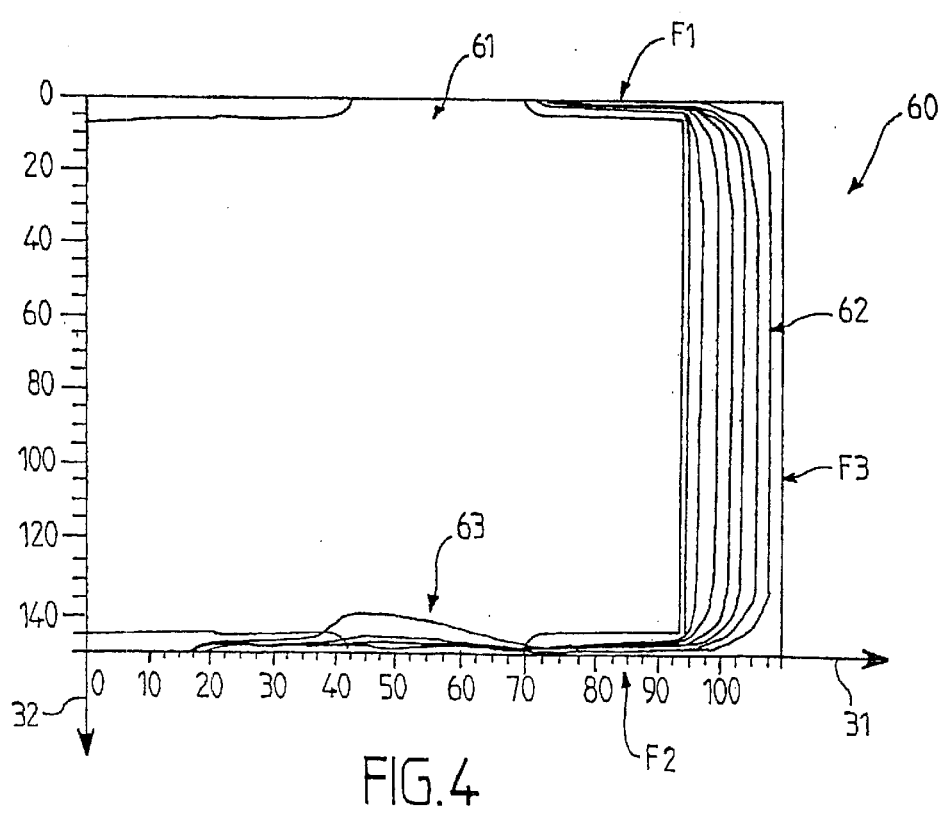
FIG. 4 shows an example of distribution of the current lines at avalanche breakdown with the embodiment of FIG. 1, in a second operating mode.

In a second operating mode, increasing the VAK voltage generates a second drilling through the electrical field in the region of the implantation 25 adjacent to the rear junction 23, on top of the drilling in the region of the front implantation 16 adjacent to the wall 2. Both junctions 13 and 23 are then connected electrically via the insulating wall 2. Breakdown is generated for a lower breakdown avalanche as in the first operating mode. In an embodiment example, for which:

a=20 µm, b=35 µm, c=20 µm, e=1 µm, VAK=450 V, VBD$^+$= 460 V.

we obtain a distribution 60 of the current lines at avalanche breakdown (FIG. 4). The current lines then comprise three parts 61, 62 and 63 extending respectively in the front zone 17, the wall 2 and the rear zone 27.

In a second embodiment of a peripheral structure for monolithic power device referred to as S2 and represented on FIG. 5, the rear face F2 is covered by a field plate 5. This field plate, in the form of metallization, results from a soldered rear face F2. Thus, contrary to the structure S1, the geometry of the structure S2 is not symmetrical. This structure S2 enables however to obtain symmetrical voltage handling in relation to a reverse-biased VAK voltage.

Moreover, the respective lengths of the implantation 25, of the zone 27 and of the implantation 26 along the rear face F2 are respectively designated by a', b' and c' which can differ from the lengths a, b and c corresponding to the level of the front face F1.

In the following examples, the lengths a', b' and c' are respectively equal to the lengths a, b and c.

When the VAK voltage is negative, the rear junction 23 is reverse-biased and the front junction 13 is forward-biased. The implantation 25 adjacent to the rear junction 23 protects the said junction. The field plate 5 requires the electrical field to drill in the region of the rear implantation 26 adjacent to the wall 2, for lower voltages than in the absence of this plate 5. The equipotential lines are then directed towards the front face F1 of the structure S2 through the wall 2.

As in the first embodiment, there is a distinction between a first operating s mode in which the electrical field does not drill into the region of the implantation 15 adjacent to the front junction 13, and a second operating mode in which this second drilling takes place in addition to that in the zone of the rear implantation 26.

Figure 6:
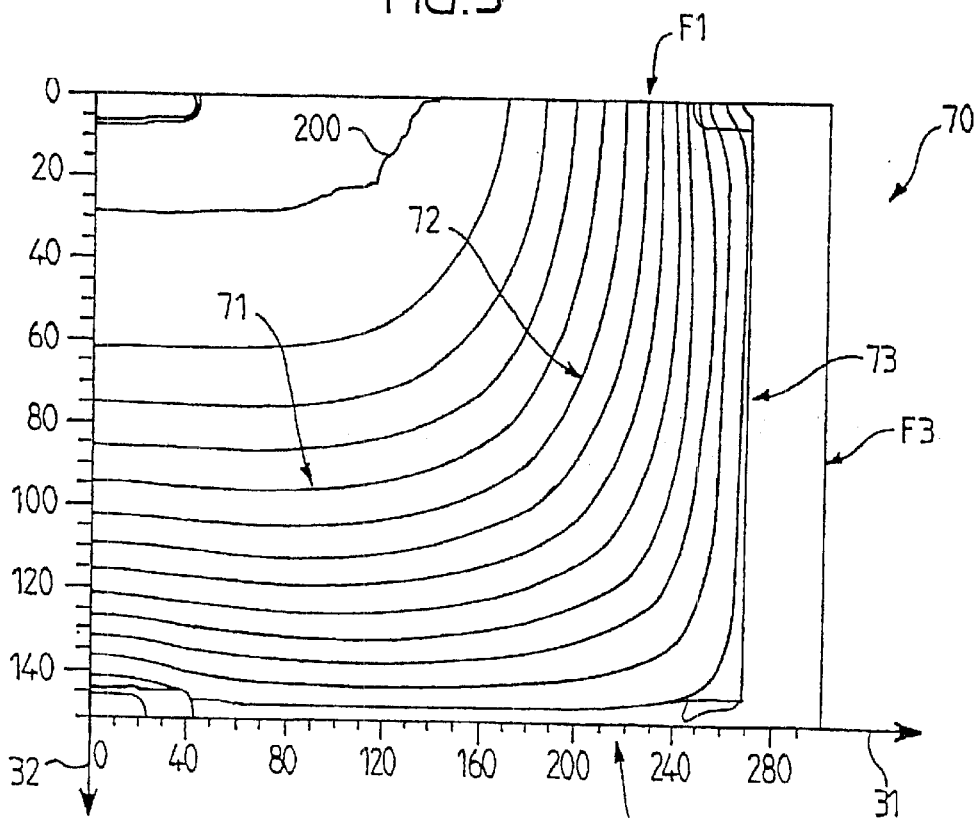
FIG. 6 shows an example of distribution of the equipotential voltage lines obtained with the embodiment of FIG. 5, in a first operating mode associated with a negative differential voltage between the anode and the cathode.

Thus, in a particular embodiment, corresponding to the first operating mode (for VAK negative voltage) and such that:

a=20 µm, b=210 µm, c=20 µm, e=1 µm, VAK=−1115 V, VBD$^+$=620 V, VBD$^-$=−1115 V, we obtain a distribution 70 of the equipotential lines (FIG. 6). The potential lines comprise a first part 71 in which they extend above the rear face F2, a second part 72 rising towards the front face F1 and a third part 73 where they rise parallel to the wall 2 up to the front face F1.

In this first operating mode (with the negative VAK voltage), the maximum electrical field responsible for avalanche breakdown is localised at the end of the region of the front implantation 16 adjacent to the wall 2.

Figure 7:
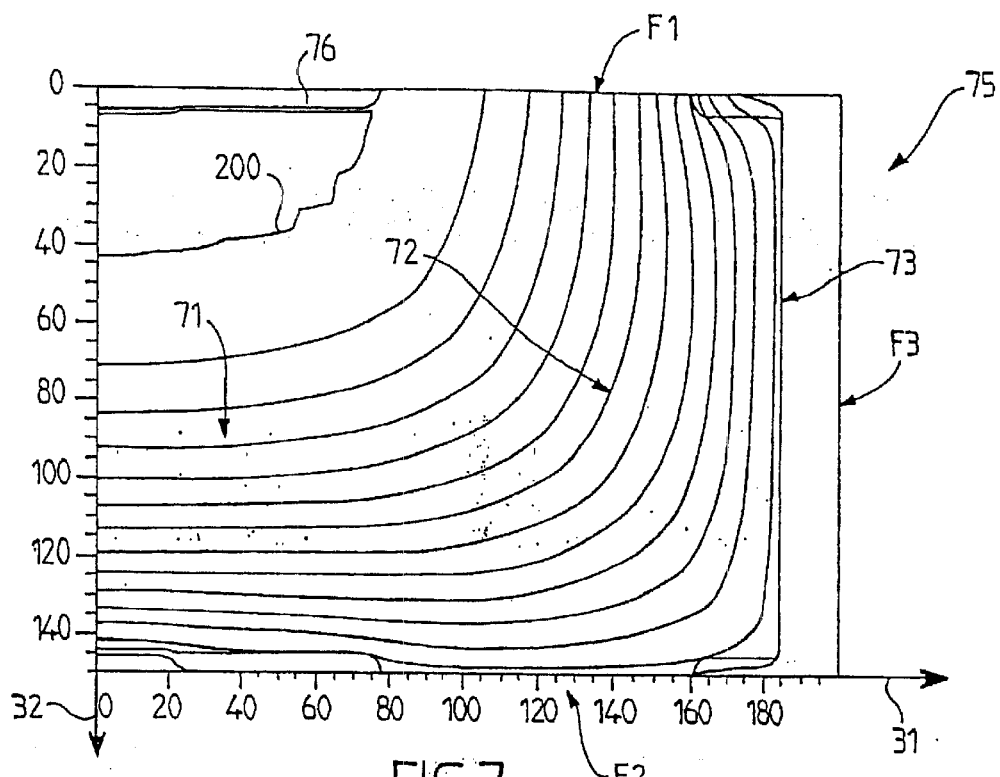
FIG. 7 shows an example of distribution of the equipotential voltage lines obtained with the embodiment of FIG. 5, in a second operating mode associated with a negative differential voltage between the anode and the cathode.

In the second operating mode (with the negative VAK voltage), there is a second drilling of the electrical field in the region of the implantation 15 adjacent to the front junction 13, whereas the junctions 13 and 23 are directly connected electrically. Thus, in a particular embodiment in which:

a=55 µm, b=90 µm, c=20 µm, e=1 µm, VAK=−800 V, VBD$^+$=945 V, VBD$^-$=−800 V, we obtain a distribution 75 of the equipotential lines (FIG. 7). We observe, on top of the parts 71, 72 and 73 similar to those of the first operating mode (FIG. 6), a fourth drilling zone 76 in the region of the implantation 15.

The operation according to the first or the second operating mode depends on the length b, whereas the second operating mode takes place when b is too small. In case of dissymmetry of the lengths a, b and c at the front F1 and rear F2 faces, it is the length b of the front face F1 that is decisive. Moreover, the critical value of the length b from which the second drilling of the electrical field is triggered, is greater by approximately 25% than the critical value obtained failing the field plate 5. This increase can be explained by the fact that the field plate 5 requires all the equipotential lines to rise towards the front face F1, instead of producing a distribution of the equipotential lines between the front F1 and rear F2 faces as in the structure S1.

When the VAK voltage is positive, the front junction 13 is reverse-biased and the rear junction 23 forward-biased. The front junction 13 is then protected by the implantation 15. Two operating modes can be distinguished according to the value of the length b.

In the first operating mode (with the positive VAK voltage), the electrical field does not drill into the region of the implantation 25 adjoining the rear junction 23. This first operating mode can present itself in two situations according to the length b. If the length b is sufficient, the equipotential lines are distributed with a conventional junction termination, whereas the maximum electrical field is distributed between the front junction 13 and the adjoining implantation 15.

In another configuration of the first operating mode, the length b is below a critical value from which the potential lines reach the region of the front implantation 16 adjoining the wall 2. They are then directed towards the rear face F2 of the structure S2 through the wall 2. An example of this configuration for which:

a=35 µm, b=45 µm, c=20 µm, e=1 µm, VAK=820 V, VBD$^+$=820 V, VBD$^-$=−300 V thus leads to a distribution 80 (FIGS. 8 and 9). A portion of the equipotential lines is concentrated thus around a zone 81 centred on the implantation 15 adjoining the front junction 13. Some of the equipotential lines are deviated at a zone 82 situated below the implantation 16 adjoining the wall 2 towards the rear face F2. These equipotential lines are thus deviated towards a window 85 forming a corner delineated by the rear F2 and lateral F3 faces and they emerge into a zone 83 at the rear field oxide 22. The metallization of the rear face F2 requires the equipotential lines to enter the oxide 22 below the region of the implantation 26 in order to come out on the lateral face F3 of the structure. In this configuration of the first operating mode, the maximum electrical field is localised in the silicium at the interface between the rear implantation 26 and the field oxide 22.

In the second operating mode (for positive VAK voltage), obtained when the length b is too small, the electrical field drills in the region of the implantation 25 adjacent to the rear junction 23.

Whether we use the first operating mode in this configuration or the second operating mode, the structure S2 should be optimised in order to reach the critical electrical field of the field oxide 22 under the field plate 5.

In a variation of the second embodiment with rear field plate 5, the lengths a, b and c differ between the front face F1 and the rear face F2. In such a case, the length b of the rear face F2 is decisive for classification in the first operating mode or the second operating mode and the distance b of the front face F1 is decisive for classification into the first configuration or in the second configuration.

In a third embodiment, with front and rear field plates, referred to as S3 and represented on FIG. 10, a front field plate 6 covers the front face F1 partially, a rear field plate 7 covers the rear face F2 completely. The field plates are obtained in the form of metallization.

The structure S3 is obtained, by soldering the rear face F2, while adding the field plate 6 on the front face.

The front field plate 6 covers the portion of the front face F1 above the implantation 15 adjacent to the front junction 13 and protrudes from this portion by a distance l, to be interrupted at the zone 17 of the substrate 1. The front field plate 6 has thus an end distant by a length f from the portion of the front face F1 above the front implantation 16, whereas the length b is the sum of the length l and f.

Moreover, the respective lengths of the implantation 25, of the zone 27 and of the implantation 26 along the rear face F2 are respectively designated by a', b' and c', which can differ from the lengths a, b and c corresponding to the level of the front face F1.

The topology of the peripheral structure S3 is therefore not symmetrical. The structure S3 enables however to obtain symmetrical voltage handling.

For the negative VAK voltage, the junction 23 is reverse-biased. The rear field plate 7 requires then the equipotential lines to reach the region of the rear implantation 26 at lower VAK voltages than in the absence of the rear field plate 7. All the equipotential lines are then directed towards the front face F1 through the wall 2. They extend then over the front face F1 from the wall 2 to the square of the front field plate 6.

There are two operating modes (with the negative VAK voltage) according to the length l. In a first operating mode, there is no second drilling of the electrical field in the region of the implantation 15 adjacent to the front junction 13, on top of the drilling at the rear implantation 26. In an embodiment corresponding to this first operating mode, we have:

a=10 µm, b=50 µm, c=20 µm, a'=20 µm, b'=40 µm, c'=20 µm, l=30 µm, f=20 µm, e=1 µm, VAK=−405 V, VBD$^+$=250 V, VBD$^-$=−470 V.

The equipotential lines exhibit then a distribution 90 (FIG. 11), comprising a portion 91 along the rear face F2, and a vertical portion 92, along the wall 2 and connecting the rear face F2 to the front face F1. The maximum electrical field responsible for the avalanche breakdown is situated at the end of the field plate 6 of the front face F1, at the zone 17.

In the second operating mode (for the negative VAK voltage), the length l is too small and there is a second drilling of the electrical field in the region of the implantation 15 adjoining the front junction 13. Thus, in an example of embodiment for which:

a=10 µm, b=70 µm, c=20 µm, a'=10 µm, b'=60 µm, c'=30 µm, l=35 µm, f=35 µm, e=1 µm, VAK=−675 V, VBD$^+$=350 V, VBD$^-$=−680 V, the distribution 100 of the equipotential lines (FIG. 12) comprises a portion 101 of lines along the rear face F2 and extending into a portion 102 substantially vertical along the wall 2, as well as a portion 103 of equipotential lines centred on the implantation 15 adjoining the front junction 13.

The front field plate 6 enables to reduce the length b significantly with respect to the corresponding structure only possessing the rear field plate 7, in order to obtain a similar voltage handling (in the case of negative bias of the VAK voltage). The reduction reaches for instance 33%.

When the VAK voltage is positive, the front junction 13 is reverse-biased. The front field plate 6 then protects the junction 13 while spreading the equipotential lines over its whole length. Tightening the equipotential lines takes place at the end of the metallization, at the zone 17. There are two operating modes according to the value of the length f.

In a first operating mode, the distance f is sufficient for dispensing with a drilling in the electrical field in the region of the front implantation 16 adjoining the wall 2. All the equipotential lines remain then on the front face F1 of the structure. The localisation of the maximum electrical field responsible for the avalanche breakdown depends on the thickness e of the front field oxide 12: it is localised either at the end of the metallization at the zone 17 or at the front junction 13. In an embodiment example in which:

a=10 $\mu$m, b=50 $\mu$m, c=20 $\mu$m, a'=20 $\mu$m, b'=40 $\mu$m, c'=20 $\mu$m, l=15 $\mu$m, f=35 $\mu$m, e=1 $\mu$m, VAK=265 V, VBD$^+$=265 V, VBD$^-$=−470 V, we obtain a distribution 110 of the equipotential lines (FIG. 13), in which the equipotential lines are centred on a region 111 in the vicinity of the implantation 15 adjacent to the front junction 13. These lines are delineated by limit lines 112 emerging into the zone 17.

In the second operating mode (for the positive VAK voltage), the distance f is smaller than a critical value so that there is a drilling in the electrical field in the region of the front implantation 16 adjoining the wall 2. Several equipotential lines are then directed towards the rear face F2 of the structure S3 through the wall 2. The presence of the rear field plate 7 requires these potential lines to enter the field oxide 22 in order to come out at the lateral face F3 on the edge of the plate. The voltage handling is determined by an avalanche breakdown in the silicium, either at the end of the front field plate 6, at the zone 17, or at the interface between the rear implantation 26 and the wall 2. The voltage handling is larger than in the absence of the rear field plate 7, with the front field plate 6. Indeed, above a certain bias voltage, the equipotential lines are directed towards the rear face F2, delineating their tightening on the front face F1. This situation can be observed on an embodiment example in which:

a=0 $\mu$m, b=81 $\mu$m, c=29 $\mu$m, a'=0 $\mu$m, b'=90 $\mu$m, c'=20 $\mu$m, l=56 $\mu$m, f=25 $\mu$m, e=3 $\mu$m, VAK=635 V, VBD$^+$=900 V, VBD$^-$=−910 V, leading to a distribution 120 of the equipotential lines (FIG. 14). A portion of the equipotential lines is tightened in a zone 121 centred on the implantation 15 adjoining the front junction 13. Several equipotential lines drill into a zone 122 centred on the front implantation 16 adjacent to the wall 2 and a large number of equipotential lines are directed towards a zone 123 centred around the rear implantation 26 adjoining the wall 2 to enter a zone 124 of the rear field oxide 22.

In both cases, with positive and negative VAK voltages, the following parameters are the more influent for voltage handling: the position of the front field plate 6, the length b and the thickness e of the field oxide 12 on the front face F1.

What is claimed is:
1. A peripheral structure for monolithic power device comprising:
   a substrate with a first doping type (N),
   a front face fitted with a connection to a cathode,
   a rear face fitted with a connection to an anode,
   a first junction adjoining one of the said faces, whereas the said junction is reverse-biased when a direct voltage is applied between the anode and the cathode,
   a second junction adjoining the face opposite to the face corresponding to the first junction, whereas the said junction is forward-biased when a direct voltage is applied between the anode and the cathode, and
   at least one insulating box with a second type of doping, connecting the front and rear faces, and disconnected electrically from the first junction,
   whereas the said structure is such that when a reverse voltage is applied between the anode and the cathode, creating equipotential voltage lines, the said insulating box enables to distribute the equipotential lines in the substrate,
   characterised in that the box is disconnected electrically from the second junction and in that the said peripheral structure is such that when a direct voltage is applied between the anode and the cathode, generating equipotential voltage lines, the said insulating box enables to distribute the said equipotential lines in the substrate.

2. A peripheral structure according to claim 1, characterised in that the said insulating box is made of a highly doped insulating vertical wall and in that the said structure comprises at least one small dose implantation zone of the second doping type, adjacent to the said wall and to one of the front and rear faces and arranged between the said wall and one of the said junctions.

3. A peripheral structure according to claim 2, characterised in that it comprises:
   at least one small dose implantation zone of the second type of doping adjacent to the first junction and to the corresponding face and arranged between the first junction and the said wall,
   at least one second small dose implantation zone of the second type of doping adjacent to the second junction and to the corresponding face and arranged between the second junction and the said wall, and
   the said implantation zones adjacent to the wall, respectively adjacent to the front and rear faces.

4. A peripheral structure according to claim 3, characterised in that the configuration of the said structure is symmetrical with respect to a plane parallel to the front and rear faces and halfway between the said faces.

5. A peripheral structure according to claim 2, characterised in that it comprises:
   a rear field plate covering the whole rear face, and
   at least one first small dose implantation zone of the second type of doping adjacent to the front face and to the corresponding junction, whereas the said implantation zone adjacent to said wall is adjacent to the front face.

6. A peripheral structure according to claim 5, characterised in that it comprises another of the said implantation zones adjacent to the wall, adjacent to the rear face.

7. A peripheral structure according to claim 2, characterised in that it comprises:
   a rear field plate covering the whole rear face,
   the said implantation zones adjacent to the said wall, respectively adjacent to the front and rear faces, a front field plate covering partially the front face between the connection to the cathode and the said implantation zone adjacent to the wall and the front face, and at least one first small dose implantation zone of the second type of doping adjacent to one of the said junctions and to the corresponding face, whereas the said structure supports at least one voltage for direct-biasing of the said junction.

8. A peripheral structure according to claim 7, characterised in that it also comprises at least one second small dose implantation zone of the second type of doping adjacent to the other junction and to the corresponding face.

9. A peripheral structure according to claim 1, characterised in that the said small dose implantation zones adjacent to the junctions are of the junction termination type.

10. A peripheral structure according to claim 1, characterised in that the said structure is of the planar type.

11. A peripheral structure according to claim 1, characterised in that the first doping type is N and the second doping type is P.

12. A peripheral structure according to claim 1, characterised in that the said structure is symmetrical with respect to a plane perpendicular to the front and rear faces and to the plane of the substrate.

13. A peripheral structure according to claim 1, characterised in that it comprises field oxides covering the front and rear faces in zones excluding the junctions and including the said insulating box, whereas the said field oxides are interposed between the front and rear faces on the one hand, and the said field plates on the other hand.

* * * * *